United States Patent
Sharma et al.

(10) Patent No.: US 10,644,595 B2
(45) Date of Patent: *May 5, 2020

(54) POWER CONVERTER CONTROLLER

(71) Applicant: Texas Instruments Incorporated, Dallas, TX (US)

(72) Inventors: Anmol Sharma, Freising (DE); Franz Prexl, Niederding (DE)

(73) Assignee: Texas Instruments Incorporated, Dallas, TX (US)

(*) Notice: Subject to any disclaimer, the term of this patent is extended or adjusted under 35 U.S.C. 154(b) by 0 days.

This patent is subject to a terminal disclaimer.

(21) Appl. No.: 16/378,837

(22) Filed: Apr. 9, 2019

(65) Prior Publication Data

US 2019/0238055 A1 Aug. 1, 2019

Related U.S. Application Data

(63) Continuation of application No. 15/900,798, filed on Feb. 21, 2018, now Pat. No. 10,298,126.

(60) Provisional application No. 62/596,597, filed on Dec. 8, 2017.

(51) Int. Cl.
| | |
|---|---|
| *H02M 3/157* | (2006.01) |
| *H03K 4/94* | (2006.01) |
| *H02M 3/158* | (2006.01) |
| *H03K 4/06* | (2006.01) |
| *H02M 1/088* | (2006.01) |
| *H02M 1/00* | (2006.01) |
| *G05F 1/575* | (2006.01) |

(52) U.S. Cl.
CPC .......... *H02M 3/157* (2013.01); *H02M 1/088* (2013.01); *H02M 3/1582* (2013.01); *H03K 4/063* (2013.01); *H03K 4/94* (2013.01); *G05F 1/575* (2013.01); *H02M 2001/0009* (2013.01)

(58) Field of Classification Search
CPC ......... H02M 2001/0009; H02M 3/157; H02M 3/1582; G05F 1/575
USPC ............... 323/241, 246, 259, 266, 274, 275, 323/280–285
See application file for complete search history.

(56) References Cited

U.S. PATENT DOCUMENTS

| | | | | |
|---|---|---|---|---|
| 7,463,011 | B2 * | 12/2008 | Sharma ............. | H02M 3/33515 323/283 |
| 2009/0066301 | A1 * | 3/2009 | Oswald ............... | H02M 3/1582 323/271 |
| 2010/0327833 | A1 * | 12/2010 | Singnurkar ......... | H02M 3/1582 323/282 |
| 2011/0156683 | A1 * | 6/2011 | Zhang ................. | H02M 3/1582 323/283 |

(Continued)

OTHER PUBLICATIONS

ST Microelectronics, "1 A, High Efficiency Single Inductor Dual Mode Buck-Boost DC-DC Converter," STBB1-AXX, Oct. 2014, DocID022197, Rev 4, 24 pages.

(Continued)

*Primary Examiner* — Gary A Nash
(74) *Attorney, Agent, or Firm* — Mark Allen Valetti; Charles A. Brill; Frank D. Cimino

(57) ABSTRACT

A circuit, comprising a trapezoidal generator that comprises digital logic configured to couple at a first input to a loop controller and at a second input to a buck-boost region detector and a driver coupled to an output of the digital logic and configured to couple to at least one power transistor of a power converter.

20 Claims, 2 Drawing Sheets

(56) References Cited

U.S. PATENT DOCUMENTS

2012/0126624 A1* 5/2012 Hester .................. G05F 1/67
  307/77
2012/0153915 A1* 6/2012 Loikkanen ............. G05F 1/618
  323/283

OTHER PUBLICATIONS

Texas Instruments, "TPS6300x, High-Efficient Single Inductor Buck-Boost Converter With 1.8-A Switches," SLVS520C, Mar. 2006, Revised Oct. 2015, 25 pages.

Texas Instruments, "TPS63025x High Current, High Efficiency Single Inductor Buck-Boost Converter," SLVSBJ9B, May 2014, Revised Mar. 2015, 30 pages.

* cited by examiner

US 10,644,595 B2

POWER CONVERTER CONTROLLER

CROSS-REFERENCE TO RELATED APPLICATIONS

Under 35 U.S.C. §§ 119(e), 120, this continuation application claims benefits of and priority to U.S. patent application Ser. No. 15/900,798, filed on Feb. 21, 2018, which claims priority to U.S. Provisional Patent Application No. 62/596,597 filed Dec. 8, 2017, by Anmol Sharma and Franz Prexl and entitled "POWER CONVERTER CONTROLLER." The entirety of the above referenced applications are hereby incorporated herein by reference as if reproduced in its entirety.

SUMMARY

Aspects of the present disclosure provide for a circuit. The circuit comprises a trapezoidal generator that comprises digital logic configured to couple at a first input to a loop controller and at a second input to a buck boost region detector and a driver coupled to an output of the digital logic and configured to couple to at least one power transistor of a power converter.

Other aspects of the disclosure provide for a switched mode power supply (SMPS). The SMPS comprises a power converter and a power converter controller. The power converter controller comprises a loop controller configured to couple to the power converter to monitor at least one electrical characteristic of the power converter and generate a control signal based at least partially on the monitored electrical characteristic of the power converter, a buck-boost region detector configured to couple to the power converter to determine whether the power converter is operating in a buck-boost region, and a gate driver configured to couple to the power converter, the power converter controller, and the buck-boost region detector to control the power converter according to a trapezoidal control pattern based at least partially on the control signal when the buck-boost region detector indicates that the power converter is operating in the buck-boost region.

Other aspects of the disclosure provide for a method. The method includes controlling a power converter to generate an output voltage according to a power transistor on-time (Ton) in which an inductor associated with the power converter is configured to charge and a power transistor off-time (Toff) in which the inductor associated with the power converter is configured to discharge. The method further includes determining whether the power converter is operating in a buck-boost region based at least partially on two of a input voltage of the power converter, the output voltage, or an inductor current of the inductor associated with the power converter. The method further includes continuing to control the power converter according to Ton and Toff when the power converter is not operating in the buck-boost region. The method further includes controlling the power converter, when the power converter is operating in the buck-boost region, to generate the output voltage according to Ton, Toff, and at least one common mode time (COM) in which an input terminal of the power converter at which the input voltage is

BRIEF DESCRIPTION OF THE DRAWINGS

For a detailed description of various examples, reference will now be made to the accompanying drawings in which.

DETAILED DESCRIPTION

Figure 1:
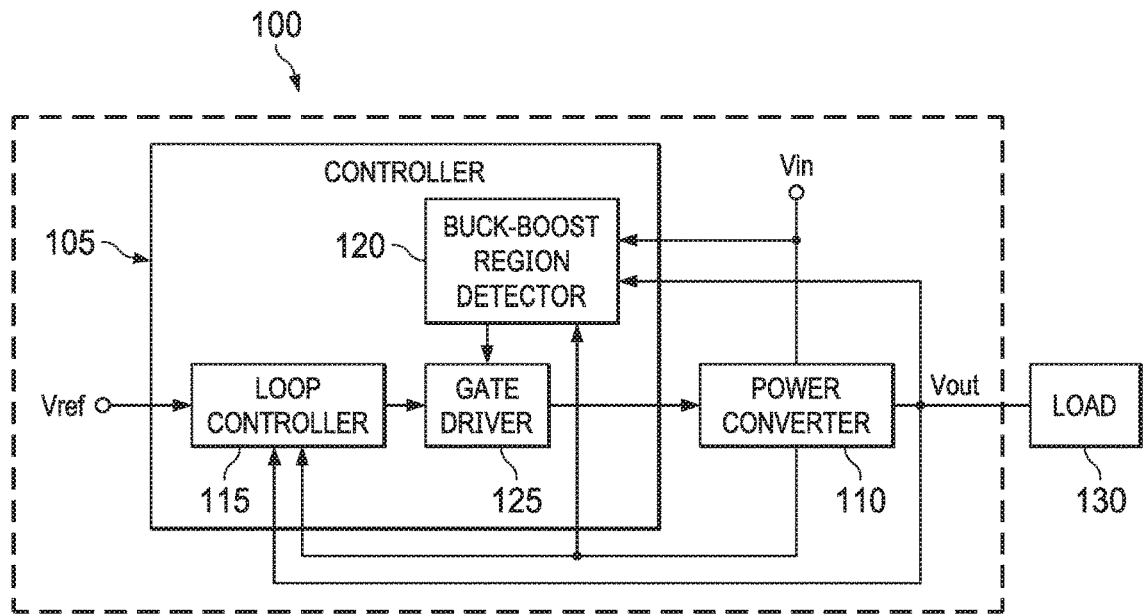
FIG. 1. is a block diagram of an illustrative switched mode power supply (SMPS)

A switched mode power supply (SMPS) transfers power from an input power source to a load by switching one or more power transistors coupled through a switch node/terminal to an energy storage element (such as an inductor/transformer and/or capacitor), which is capable of coupling to the load. The power transistors can be included in a power converter that includes, or is capable of coupling to, the energy storage element. An SMPS can include an SMPS controller to provide one or more gate drive signals to the power transistor(s). In some architectures (such as buck, boost, and/or buck-boost), the SMPS includes, or is capable of coupling to, an output/bulk capacitor in parallel with the load, and the SMPS controller switches the power transistor(s) to form circuit arrangements with the energy storage element(s) to supply a load current to the load and/or to the output/bulk capacitor to maintain a regulated output voltage (e.g., by filtering the switched load current). For example, a power transistor can be coupled through the switch node/terminal to an energy storage inductor, which is switched by the SMPS controller between charge and discharge cycles to supply inductor current (e.g., current through an energy storage inductor) to the load and to the output/bulk capacitor to filter the inductor current to maintain the regulated output voltage. In some examples, an SMPS can be configured for operation as a constant current source with an energy storage element but with no output/bulk capacitor.

The power transistors may be implemented as metal oxide semiconductor field effect transistors (MOSFETs) or other suitable solid-state transistor devices (e.g., such as bi-polar junction transistors (BJTs)). During modes of operation of a power converter (such as a buck-boost power converter) in which a value of the input voltage is near a value of the output voltage (sometimes referred to as a buck-boost region), controlling one power transistor's on state at a time (e.g., commutating between only two power transistors of the power converter at a time) may increase efficiency of the power converter and generate a trapezoidal inductor current waveform (e.g., a waveform having a generally trapezoidal shape). In a power converter operating according to a peak/valley current mode (PVCM), achieving this trapezoidal waveform may be challenging at least partially as a result of the power converter including only on (e.g., charging) and off (e.g., discharging) states. Attempting to achieve this trapezoidal waveform using on and off states may result in inconsistently generated waveforms that may be distorted and/or have unpredictable shapes or characteristics. In contrast, generating the trapezoidal inductor current waveform may utilize on, off, and common states, where the common state is a state in which the input and the output of the power converter are shorted through an energy storage element (e.g., an inductor) of the power converter.

At least some aspects of the present disclosure relate to a controller that may be suitable for implementation for controlling a power converter, such as in a SMPS. In at least one example, the controller controls the power converter according to on, off, and common states to generate a trapezoidal inductor current waveform. Generation of the trapezoidal current waveform according to the on, off, and common states, in at least one example mitigates and/or removes at least some of the distortion and/or unpredictable shape characteristics associated with attempting to achieve the trapezoidal inductor current waveform using only on and off states. At least some examples of the controller control the power converter to generate the trapezoidal inductor current waveform in a fixed frequency system while other examples of the controller control the power converter to generate the trapezoidal inductor current waveform in a timing based system that lacks a fixed clock and/or in non-constant frequency systems.

Referring now to FIG. 1, a block diagram of an illustrative SMPS 100 is shown. In at least one example, the SMPS 100 includes a controller 105 and a power converter 110. The power converter 110 is, for example, a buck-boost power converter that is capable of operating in a buck-boost region. In other examples, the power converter 110 is any other type of power converter such as a buck power converter, a boost power converter, or a hybrid power converter. In at least one example, the controller 105 includes, or is configured to couple to, a loop controller 115, a buck-boost region detector 120, and a gate driver 125. At least one example of the SMPS 100 includes at least some aspects of the controller 105 and the power converter 110 on a same semiconductor die and/or in a same component package, while in other examples the controller 105 and the power converter 110 may be fabricated separately and configured to couple together. For example, at least some aspects of the controller 105 may be fabricated separately and coupled together. Accordingly, while illustrated as including the gate driver 125, in at least one example the controller 105 does not include the gate driver 125 and instead is configured to couple to the gate driver 125.

In at least one example, the SMPS 100 is configured to receive an input voltage (Vin) from an input power source (not shown) and provide an output voltage (Vout) at an output terminal based at least partially on the input voltage and a reference voltage (Vref) received by the SMPS 100. Vref may be received from any suitable device (not shown) such as a processor, microcontroller, or any other device exerting control over the SMPS 100 to control a value of Vout and may be, or be representative of, a predetermined (e.g., user-desired, target, preconfigured, programmed, etc.) value for Vout. The SMPS 100, in at least one example, provides Vout to a load 130 that is coupled to the SMPS 100 (e.g., coupled to the SMPS 100 at an output of the power converter 110). In at least one example, the controller 105 receives one or more signals from the power converter 110. For example, the controller 105 may receive Vout from the power converter 110 and/or a value representative of an inductor current (IL) of the power converter 110. In various examples, the value representative of IL may be a value directly measured from an inductor (not shown) of the power converter 110 (or a terminal of another component of the power converter 110 to which the inductor is also coupled) or a value sensed from a sense element (not shown) of the power converter 110. The sense element is, for example, a sense resistor, a transistor, or any other component or combination of components capable of measuring IL of the power converter 110 and providing the value representative of IL to the controller 105.

In at least one example, the buck-boost region detector 120 is any circuitry suitable for determining whether the power converter 110 is operating in the buck-boost region (e.g., when the power converter 110 is implemented as a buck-boost converter), and a particular architecture or scope of the buck-boost region detector 120 is not limited herein. In various examples, the buck-boost region detector 120 receives Vin, Vout, and IL and determines whether the power converter 110 is operating in the buck-boost region at least partially based on any one or more of Vin, Vout, and/or IL. For example, the buck-boost region detector 120 determines and/or indicates whether the power converter 110 is operating in the buck-boost region based at least partially on a ratio of Vin to Vout, a ration of Vout to Vin, a value of any one or more of Vin, Vout, and/or IL exceeding any one or more respective thresholds, and/or any other suitable criteria. In at least one example, the buck-boost region detector 120 is coupled, and provides a signal, to the gate driver 125 to indicate to the gate driver 125 when, or if, the power converter 110 is operating in the buck-boost region.

In at least one example, the loop controller 115 is coupled to the gate driver 125 and the power converter 110 and is configured to receive Vref and Vout, for example, at least partially for use in controlling the gate driver 125. In another example, the loop controller 115 further receives the value representative of IL from the sense element of the power converter 110 further for use in controlling the gate driver 125. Based on the received inputs (e.g., Vin, Vout, the value representative of IL, and/or Vref), the loop controller 115 controls the gate driver 125 to control power transistors (not shown) of the power converter 110 to generate Vout. In one example, the gate driver 125 controls the power converter 110 according to a peak current mode implementation of the power converter 110 in which the power transistors of the power converter 110 are controlled based on IL of the power converter 110 rising to meet a threshold (e.g., such as based at least partially on Vref). In another example, the gate driver 125 controls the power converter 110 according to a valley mode implementation of the power converter 110 in which the power transistors of the power converter 110 are controlled based on IL of the power converter 110 falling to meet a threshold (e.g., such as based at least partially on Vref). For example, the loop controller 115 controls the gate driver 125 to control an on-time (Ton) of the power transistors in a peak current mode implementation of the power converter 110, or an off-time (Toff) of the power transistors in a valley current mode implementation of the power converter 110, by providing at least one control signal to the gate driver 125.

In at least one example, the loop controller 115 integrates Vout (or a scaled version of Vout, such as scaled via a voltage divider) and Vref. In another example, the loop controller 115 compares Vout (or a scaled version of Vout, such as scaled via a voltage divider) to Vref. A result of the integration (or the comparison) is compared to the value representative of IL. A result of the comparison is, for example, used to control the gate driver 125. In at least one example, the output of the comparison may be a logical high signal when the value representative of IL is less than the result of the integration (or the comparison) and the power converter 110 is implemented using the peak current mode implementation. When the value representative of IL is not less than the result of the integration (or the comparison) the output of the comparison may be a logical low signal. In another example, the output of the comparison may be a logical high signal when the value representative of IL is greater than the result of the integration (or the comparison) and the power converter 110 is implemented using the valley current mode implementation. When the value representative of IL is not greater than the result of the integration (or the comparison) the output of the comparison may be a logical low signal. In various examples, the loop controller 115 includes any suitable circuitry or components for controlling the gate driver 125 to control the power converter 110 as disclosed herein.

In at least one example, the loop controller 115 may comprise an integrator (not shown) and a comparator (not shown). In another example, the loop controller 115 may further include, or be coupled to, a voltage divider (not shown) that may scale the value of Vout. In another example, the loop controller 115 may further include one or more supporting components (not shown) such as resistors, capacitors, diodes, and the like, a scope of which is not limited herein. In some examples, the loop controller 115 may include a common (COM) time generator (not shown) that may generate a COM1 and/or COM2 time. The COM1 and/or COM2 time, for example, may be a period of time in which Vout is shorted to Vin in the power converter 110 such as though an energy storage element (e.g., an inductor). The COM generator may be, for example, a resistor-capacitor (RC) timer or other form of timer, a scope of which is not limited herein. In some examples, the loop controller 115 may provide any number of control signals to the gate driver 125 to control the gate driver 125.

In various examples, the gate driver 125 is any suitable driver, component, or combination of components for controlling the power converter 110 (e.g., by coupling to, and exerting control on, gate terminals of the power transistors of the power converter 110). In at least one example, the gate driver 125 includes at least one driver (not shown) configured to generate a high-current control gate drive signal based on a received input signal. For example, when the gate driver 125 receives a first input signal from the loop controller 115, the gate driver 125 may control a first subset of power transistors of the power converter 110 to turn (or remain) on while controlling a remainder of the power transistors of the power converter 110 to remain (or turn) off. When the gate driver 125 receives a second input signal from the loop controller 115, the gate driver 125 may control a second subset of the power transistors of the power converter 110 to turn (or remain) on and a remainder of the power transistors of the power converter 110 to remain (or turn) off. In some examples, the loop controller 115 may include the COM time generator (not shown) that may generate the COM1 and/or COM2 time.

In at least one example, the gate driver 125 receives an indication from the buck-boost region detector 120 indicating whether the power converter 110 is operating in the buck-boost region. When the power converter 110 is not operating in the buck-boost region, the gate driver 125 may control the power converter 110 directly according to an input (e.g., a control signal) received from the loop controller 115. For example, when the power converter 110 is not operating in the buck-boost region, the gate driver 125 may control the power converter 110 to generate a triangular inductor current waveform (e.g., a waveform having a generally triangular shape) based on the input received by the gate driver 125 from the loop controller 115. The triangular current waveform is formed, in at least one example, by controlling the power converter to operate either in a charging mode of operation or a discharging mode of operation without operating in a common mode of operation (e.g., a mode of operation in which Vin is shorted to Vout, such as through an energy storage element of the power converter 110). To control the power converter 110 according to inputs received from both the loop controller 115 and the buck-boost region detector 120, in at least one example the gate driver 125 further includes one or more components suitable for making determinations. The components may be, for example, analog comparators, digital Boolean logic structures, or any other suitable components capable of providing an indication to an amplifier of the gate driver 125 based on inputs received from both the loop controller 115 and the buck-boost region detector 120.

When the power converter 110 is operating in the buck-boost region, the gate driver 125 may control the power converter 110 to generate a trapezoidal inductor current waveform. In this way, the gate driver 125 is, in some examples, referred to as a trapezoidal generator. For example, the gate driver 125 may control the power converter 110 to charge the inductor (e.g., the Ton mode) when the gate driver 125 receives a logical high signal from the loop controller 115 and the power converter 110 is operating in the buck-boost region of a peak current mode implementation. In another example, the gate driver 125 may control the power converter 110 to discharge the inductor (e.g., the Toff mode) when the gate driver 125 receives a logical high signal from the loop controller 115 and the power converter 110 is operating in the buck-boost region of a valley current mode implementation, the details of which are not included herein but are substantially similar to the details for the peak current mode implementation.

When the signal received from the loop controller 115 transitions from a logical high signal to a logical low signal, the gate driver 125 may initialize a timer for a period of time during which the gate driver 125 controls the power converter 110 to operate in the COM1 mode. Alternatively, the gate driver 125 may receive the timer signal from the loop controller 115. At the expiration of the timer (e.g., as may be determined by comparing an output of the timer to a reference value using a comparator), the gate driver 125 may control the power converter 110 to operate in the Toff mode. Alternatively, the gate driver 125 may receive a signal from the loop controller 115 indicating to the gate driver 125 to control the power converter 110 to operate in the Toff mode (e.g., such as subsequent to a determination by the loop controller 115 that the timer maintained by the loop controller 115 has expired).

At a conclusion of the Toff time (e.g., as determined by the gate driver 125 or based on a signal received by the gate driver 125 from the loop controller 115), the gate driver 125 may initialize a timer for a period of time during which the gate driver 125 controls the power converter 110 to operate in the COM2 mode. Alternatively, the gate driver 125 may receive the timer signal from the loop controller 115. At the expiration of the timer, the gate driver 125 may control the power converter 110 to operate in the Ton mode as previously discussed. In this way, the controller 105 controls the power converter 110 (e.g., via the loop controller 115, the buck-boost region detector 120, and/or the gate driver 125) to generate a trapezoidal inductor current waveform.

Figure 2:
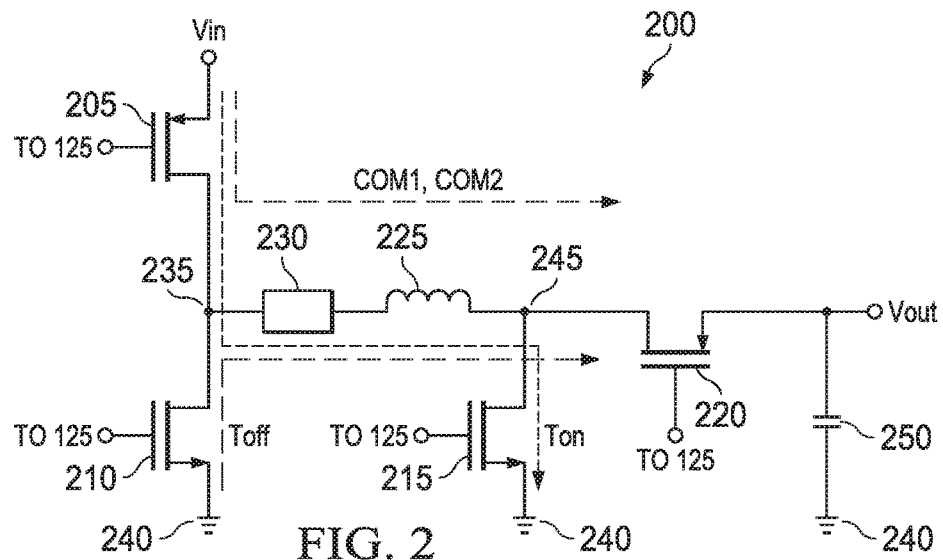
FIG. 2 is a schematic diagram of an illustrative buck-boost power converter.

Referring now to FIG. 2, a schematic diagram of an illustrative buck-boost power converter 200 is shown. In at least one example, the buck-boost power converter 200 is suitable for implementation as the power converter 110 of the SMPS 100 of FIG. 1, discussed above. In one example, the buck-boost power converter 200 includes a plurality of metal oxide semiconductor field effect transistors (MOSFETs) 205, 210, 215, and 220, and at least one energy storage device (illustrated in this example as an inductor 225). In another example, the buck-boost power converter 200 further includes a second inductor (not shown) and/or a fly-capacitor (not shown). In one example, the MOSFETs 205 and 220 are implemented as p-type MOSFETs (PMOS) and the MOSFETs 210 and 215 are implemented as n-type MOSFETs (NMOS). In at least one example, the buck-boost power converter 200 further includes a sense element 230 suitable for sensing IL of the inductor 225. The sense element 230 is, for example, a MOSFET, a resistor, or any other suitable means of sensing, measuring, or detecting IL. In at least one example, the sense element 230 is implemented by one of the MOSFETs 205, 210, 215, or 220 such that the sense element 230 is not an independent, additional component of the buck-boost power converter 200.

In one example architecture, a source terminal of the MOSFET 205 is configured to receive Vin, a drain terminal of the MOSFET 205 is coupled to a node 235, and a gate terminal of the MOSFET 205 is coupled to a controller (e.g., such as the gate driver 125 of the controller 105 of the SMPS 100 of FIG. 1, discussed above). A drain terminal of the MOSFET 210 is coupled to the node 235, a source terminal of the MOSFET 210 is coupled to a ground node 240, and a gate terminal of the MOSFET 210 is coupled to the controller. A first terminal of the inductor 225 is coupled to the node 235 and a second terminal of the inductor 225 is coupled to a node 245. In at least one example, the sense element 230 is coupled in series between node 235 and the first terminal of the inductor 225. In another example, a drain terminal of the MOSFET 215 is coupled to the node 245, a source terminal of the MOSFET 215 is coupled to the ground node 240, and a gate terminal of the MOSFET 215 is coupled to the controller. A drain terminal of the MOSFET 220 is coupled to the ground node 240, a source terminal of the MOSFET 220 provides Vout from the buck-boost power converter 200 (e.g., such that the source terminal of the MOSFET 220 is configured to couple to a load (not shown)), and a gate terminal of the MOSFET 220 is coupled to the controller. In at least one example, the inductor 225 is implemented as an external component such that the buck-boost power converter 200 does not include the inductor 225 but is configured to couple to the inductor 225 between the node 235 and the node 245. In at least one example, the buck-boost power converter 200 is configured to couple to a capacitor 250 (e.g., such as a filtering capacitor) between the source terminal of the MOSFET 220 and the ground node 240.

In one example, the MOSFETs 205, 210, 215, and/or 220 are controlled to turn on (e.g., conduct current between their respective drain terminals and source terminals) and/or turn off (e.g., cease conducting current between their respective drain terminals and source terminals) based on a signal received at their respective gate terminals. For example, based on a signal (e.g., a control signal) received from the controller, one or more of the MOSFETs 205, 210, 215, and/or 220 are controlled to turn on or turn off. The MOSFETs 205, 210, 215, and/or 220 may turn on (or off) based on a value, or relationship between values, present at one or more of the respective gate terminals and/or source terminals of the MOSFETs 205, 210, 215, and/or 220.

As further illustrated in FIG. 2, in at least one example the buck-boost power converter 200 is configured to operate in at least three operations modes. During a first operation mode (e.g., Ton), MOSFETs 205 and 215 are controlled by the controller to be turned on while MOSFETs 210 and 220 are controlled by the controller to be turned off. During the first operation mode, a path from Vin to ground is formed through the MOSFET 205, inductor 225, and MOSFET 215, thereby enabling the inductor 225 to charge from Vin. During a second operation mode (Toff), MOSFETs 205 and 215 are controlled by the controller to be turned off while the MOSFETs 210 and 220 are controlled by the controller to be turned on. During the second operation mode, a path from the ground node 240 to a node (e.g., the source terminal of the MOSFET 220) of the buck-boost power converter 200 to which a load may couple to receive Vout is formed through the MOSFET 210, inductor 225, and MOSFET 220, thereby enabling the inductor 225 to discharge to provide Vout. During a third operation mode (COM1 and/or COM2), MOSFETs 205 and 220 are controlled by the controller to be turned on and the MOSFETs 210 and 215 are controlled by the controller to be turned off. During the third operation mode, Vin and Vout have approximately the same value such that a voltage difference across the inductor 225 is minimal. When the voltage difference across the inductor 225 is minimal, in at least one example the inductor 225 may function approximately as a short between Vin and Vout with minimal effects on the value of Vout.

Figure 3:
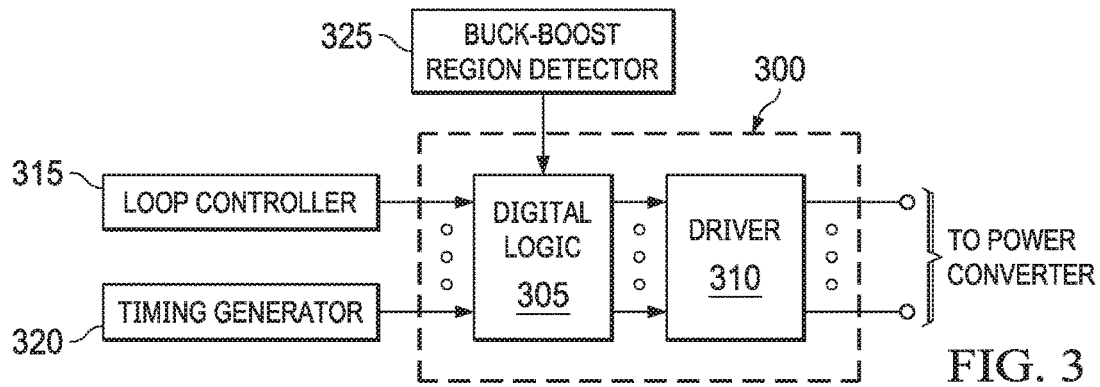
FIG. 3 is a block diagram of an illustrative gate driver.

Referring now to FIG. 3, a block diagram of an illustrative gate driver 300 is shown. In at least one example, the gate driver 300 is suitable for implementation in a SMPS such as implementation as the gate driver 125 of the SMPS 100 of FIG. 1, discussed above. In at least one example, the gate driver 300 includes digital logic 305 and a driver 310. In some examples, the digital logic 305 is configured to couple at a first input to a loop controller 315 (which may be implemented as the loop controller 115 discussed above with respect to FIG. 4 and further described below with respect to FIG. 4) and at a second input to a timing generator 320. The timing generator 320 is, in some examples, included as a component of the gate driver 300, while in other examples the timing generator 320 is external to the gate driver 300 (e.g., such as implemented as a portion of the loop controller 315). In at least one example, the digital logic 305 is further coupled to, and configured to receive at least one signal from, a buck-boost region detector 325 such as the buck-boost region detector 120, described above with respect to FIG. 1. In some examples, the digital logic 305 receives a signal from the buck-boost region detector 325 indicating that a power converter under the control of the gate driver 300 is operating in a buck-boost region. In other examples, the digital logic 305 further receives signals from the buck-boost region detector 325 indicating that the power converter is operating in a buck region or operating in a boost region. In such examples, the buck-boost region detector 325 may not be limited to detection of, or in, a buck-boost region and may generally be termed a mode detector. In at least one example, the driver 310 is coupled at an input to an output of the digital logic 305 and is coupled at one or more outputs to respective power transistors of a power converter under the control of the gate driver 300.

The digital logic 305 may be any suitable digital logic capable of making determinations and providing an output signal based on received inputs. For example, the digital logic 305 may be any one, or combination, of a digital state machine, a plurality of digital logic gates, or any other suitable digital and/or analog logic structure(s). In an example of the digital logic 305 implemented as a digital state machine, the digital state machine includes multiple states and transitions from one of the multiple states to another of the multiple of states based on one or more inputs. At each of the multiple states, the digital state machine outputs one or more signals. For example, based on any one or more of a value of the signal received from the buck-boost region detector 325, a value of the signal received from the loop controller 315, and/or a value of a signal received from the timing generator 320, the digital state machine outputs one or more signals to the driver. In at least one example, each unique combination of possible input signals from the buck-boost region detector 325, the loop controller 315, and/or the timing generator 320 may correspond to a state of the state machine. Each state of the state machine may further correspond to a unique combination of output signals from the digital state machine and digital logic 305. For example, for a first combination of input signals, the digital state machine may exist and/or transition to a first state and output a first combination of output signals. Based on a change to one or more of the input signals of the first combination of input signals, the digital state machine may transition to a second state and output a second combination of output signals. In various examples, the digital state machine may receive any number of input signals, include any number of states, and output any number of output signals. In at least one example, the digital state machine is implemented via one or more digital logic gates, one or more data storage elements (e.g., such as D-flip flops or registers), or any other circuits or components capable of generating at least one output signal based on a combination of input signals.

The driver 310 may be implemented and/or constructed as any suitable structure for controlling gate terminals of power transistors based on one or more signals received from the digital logic 305. In at least one example, the driver 310 includes additional digital logic (not shown) and one or more digital drivers (not shown) corresponding to each power transistor of the power converter under the control of the gate driver 300. Based on the additional digital logic processing the signals received from the digital logic 305, at least some of the digital drivers output gate drive signals to respective power transistors of the power converter under the control of the gate driver 300.

In at least one example of operation, the digital logic 305 receives signals from at least some of the loop controller 315, the timing generator 320, and/or the buck-boost region detector 325 and, based on the received signals, generates one or more control signals for controlling the driver 310. In some examples, the digital logic 305 outputs a plurality of control signals to the driver 310 such that each control signal uniquely corresponds to one of the digital drivers to cause the driver 310 to uniquely control a corresponding gate terminal of a power transistor of the power converter under the control of the gate driver 300. In yet other examples, the digital logic 305 outputs a plurality of control signals to the driver 310 such that each control signal uniquely corresponds to a pair of the digital drivers to cause the driver 310 to uniquely control corresponding gate terminals of a pair of power transistors of the power converter under the control of the gate driver 300. For example, based on one control signal received from the digital logic 305, the driver 310 may control two digital drivers, such as by controlling a first digital driver using the control signal directly and controlling a second digital driver using an inverted version of the control signal, inverted by the additional digital logic of the driver 310.

When the digital logic 305 receives a signal from the loop controller indicating that the power converter under the control of the gate driver 300 should operate in a Ton mode (e.g., in a peak current mode implementation) and receives a signal from the buck-boost region detector 325 indicating that the power converter is not operating in the buck-boost region, the digital logic 305 may generate control signals to cause the driver 310 to control the power converter to generate a triangular inductor current waveform. When the digital logic 305 receives a signal from the loop controller indicating that the power converter under the control of the gate driver 300 should operate in the Ton mode (e.g., in the peak current mode implementation) and receives a signal from the buck-boost region detector 325 indicating that the power converter is operating in the buck-boost region, the digital logic 305 may generate control signals to cause the driver 310 to control the power converter to generate a trapezoidal inductor current waveform, as further described below with respect to FIG. 5. Based at least partially on the control signals received from the digital logic 305 (e.g., subject to processing by the additional digital logic), the driver 310 generates one or more gate drive signals for controlling one or more respective gate terminals of power transistors of the power converter under the control of the gate driver 300. In at least one example, the driver 310 generates gate drive signals to change only one power transistor's on state at any given time.

Figure 4:
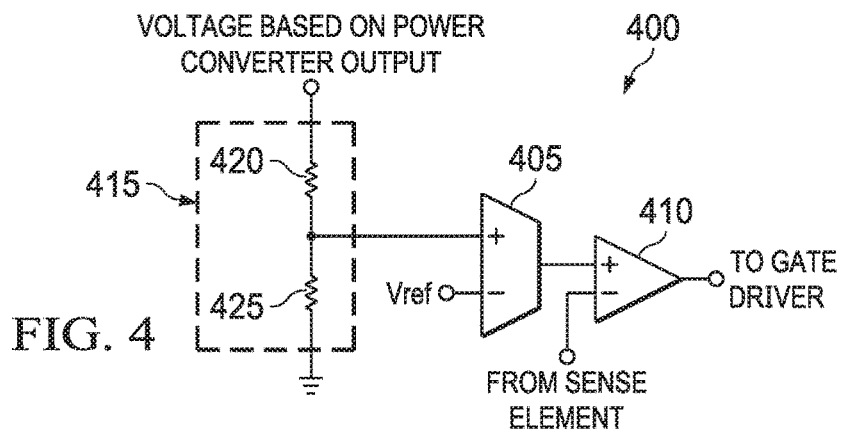
FIG. 4 is a block diagram of an illustrative loop controller.

Referring now to FIG. 4, a block diagram of an illustrative loop controller 400 is shown. In at least one example, the loop controller 400 is suitable for implementation in a SMPS such as implementation as the loop controller 115 of the SMPS 100 of FIG. 1, discussed above. In at least one example, the loop controller 400 includes an integrator 405 and a comparator 410. In some examples, the loop controller 400 further includes, or is configured to couple to, a voltage divider 415 comprising a resistor 420 and a resistor 425 coupled, or configured to couple, in series between the output of the power converter and a ground potential. In at least some examples, the loop controller 400 further includes, or is configured to couple to, one or more additional components (not shown) such as resistors, capacitors, diodes (e.g., to limit a positive and/or negative voltage at a node in the loop controller 400), etc.

In one example architecture, a first input of the integrator 405 is configured to receive a feedback signal at least partially based on a value present at an output of a power converter controlled at least partially according to the loop controller 400. For example, the first input of the integrator 405 may be coupled to, or configured to couple to, the output of the power converter. Alternatively, the first input of the integrator 405 may be coupled to, or configured to couple to, an intermediary component such as the voltage divider 415 to receive a feedback signal based at least partially on the value present at the output of the power converter. A second input of the integrator 405 is configured to receive a reference value. The reference value, in some examples, is representative and/or indicative of a predetermined (e.g., user-desired, target, preconfigured, programmed, etc.) output voltage and/or current of the power converter controlled at least partially according to the loop controller 400. For example, the reference value may be substantially equal to the predetermined output voltage and/or current or may be substantially equal to a scaled representation of the predetermined output voltage and/or current. When the reference value is substantially equal to a scaled representation of the predetermined output voltage and/or current, a scaling factor of the reference value may be approximately equal to a ratio of the resistor 420 to the resistor 425. In at least one example, the reference value is received from a component (not shown) internal to the loop controller 400 and/or the SMPS. The component may be, for example, an internal band-gap reference suitable for providing the reference value. In another example, the reference value is received from a component outside of the loop controller 400 and/or the SMPS and to which the integrator 405 is configured to couple either directly or indirectly. The component outside of the loop controller 400 and/or the SMPS is, for example, a voltage regulator, micro-controller, a processor, and/or any other device suitable for providing the reference value to the loop controller 400.

In at least one example, an output of the integrator is coupled to a first input of the comparator 410 and a second input of the comparator 410 is coupled to, or configured to couple to, a sense element of the power converter controlled at least partially according to the loop controller 400. In some examples, a value present at, measured by, or otherwise provided to the comparator 410 by coupling to the sense element indicates an amount of current flowing through the power converter (e.g., such as through an inductor of the power converter when the power converter is a buck-boost power converter). In at least one example, when the value received at the first input of the comparator 410 exceeds the input received at the second input of the comparator 410, a value present at the output of the comparator 410 has a logical high value. In at least some examples, the value present at the output of the comparator 410 is at least partially used for controlling operation of the power converter (e.g., such as controlling a gate driver to control gate terminals of power transistors of the power converter as described above with respect to FIGS. 1 and 2).

Figure 5:
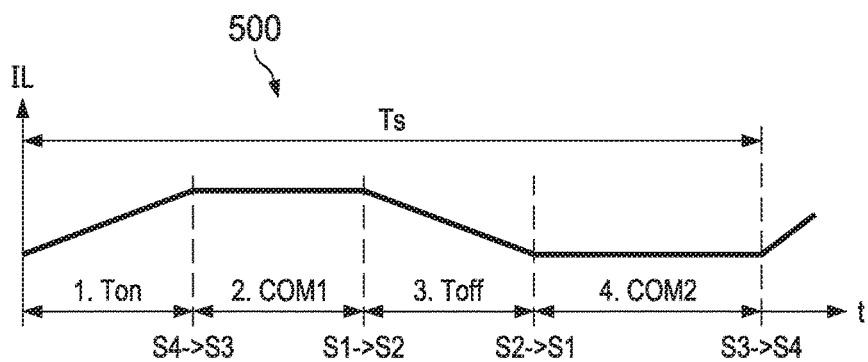
FIG. 5 is an illustrative timing diagram for controlling a power converter.

Referring now to FIG. 5 an illustrative timing diagram 500 for controlling a power converter is shown. The timing diagram 500 illustrates at least one example of IL in a power converter controlled by a controller to generate a trapezoidal inductor current waveform. For example, the timing diagram 500 may be representative of at least one example of implementation of the controller 105 controlling the power converter 110, each of the SMPS 100 discussed above with respect to FIG. 1. Accordingly, at least some aspects of the timing diagram 500 correspond to at least some examples of the SMPS 100 of FIG. 1 and the buck-boost power converter 200 of FIG. 2. In FIG. 5, the vertical access represents IL increasing in a bottom to top direction, the horizontal access represents time (t) increasing in a left to right direction, Ts represents the time of one switching cycle of the power converter, and the remaining labels are as defined above with reference to FIGS. 1 and 2.

In at least one example of operation, during the Ton mode, an inductor of the power converter charges, increasing IL. At the end of the Ton mode (e.g., as determined by the loop controller 115 at least partially based on Vref, as discussed above with respect to FIG. 1), the controller provides control signals to turn the MOSFET 215 off and turn the MOSFET 220 on to enter the COM1 mode. During the COM1 mode, a minimal amount of current may discharge from the inductor, for example, as a result of a minimal voltage differential across the inductor. At the end of the COM1 mode (e.g., as determined by the expiration of a timer in the loop controller 115 or the gate driver 125, as discussed above with respect to FIG. 1), the controller provides control signals to turn the MOSFET 205 off and turn the MOSFET 210 on to enter the Toff mode. During the Toff mode, the inductor discharges, decreasing IL. At the end of the Toff mode, the controller provides control signals to turn the MOSFET 210 off and turn the MOSFET 205 on to enter the COM2 mode. During the COM2 mode, a minimal amount of current may discharge from the inductor, for example, as a result of a minimal voltage differential across the inductor. At the end of the COM2 mode, the controller provides control signals to turn the MOSFET 220 off and turn the MOSFET 215 on to return to the Ton mode.

In at least one example, the controller controls a length of time of the Ton mode or the Toff mode to control the value of Vout. For example, in a peak current mode implementation of the power converter, the controller controls a length of time of the Ton mode to at least partially control the value of Vout. The value of Ton may be variable from one switching cycle of the power converter to another switching cycle of the power converter. In this example, a length of time of each of the COM1 and COM2 modes may be fixed. Alternatively, the length of time of the COM1 and/or COM2 modes may be variable to compensate for transient effects of the power converter and/or to provide control of a switching frequency of the power converter. Similarly, in another example the controller controls Toff to be a fixed period of time as a function of Vin and Vout. For example, the controller may control the length of time of the Ton mode and may fix the length of the Toff mode at respective lengths of time to approximately satisfy the below equation 1 relating Vout to Vin.

$$\frac{Vout}{Vin} = \frac{\left(1 - \frac{Toff}{Ts}\right)}{1 - \frac{Ton}{Ts}}. \qquad (1)$$

In another example, in a valley current mode implementation of the power converter, the controller controls a length of time of the Toff mode to at least partially control the value of Vout. The value of Toff may be variable from one switching cycle of the power converter to another switching cycle of the power converter. In this example, a length of time of each of the COM1 and COM2 modes may be fixed, or the time of the COM1 and/or COM2 modes may be variable to compensate for transient effects of the power converter and/or to provide control of a switching frequency of the power converter. Also in this example, the controller may control Ton to be a fixed period of time that may be a function of Vin and Vout. In at least one example, the controller may control the length of time of the Toff mode and may fix the length of the Ton mode at respective lengths of time to satisfy the above equation 1 relating Vout to Vin.

While IL is illustrated in FIG. 5 as an isosceles trapezoidal, in at least some examples the shape of IL varies according to changing Vin and/or Vout conditions. For example, IL illustrated in FIG. 5 may be representative of a condition in which Vin is approximately equal to Vout. When Vin is less than Vout, and/or when Vin is greater than Vout, the shape of IL may change such that a slope of IL during the Ton mode and/or Toff mode may each increase and/or decrease and a slope of IL during the COM1 and/or COM2 modes may increase and/or decrease.

Figure 6:
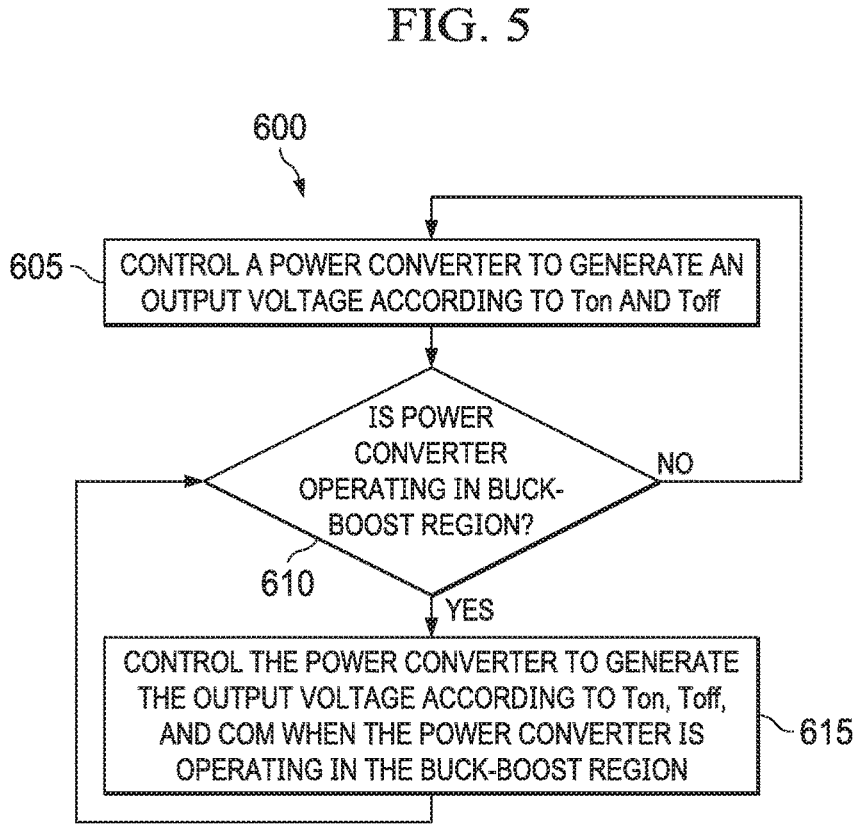
FIG. 6 is a flowchart of an illustrative method for controlling a power converter.

Referring now to FIG. 6, a flowchart of an illustrative method 600 for controlling a power converter is shown. The method 600 is performed, for example, by a controller such as the controller 105 of FIG. 1 to control a power converter such as the power converter 110 of FIG. 1 (which may be implemented as the buck-boost power converter 200 of FIG. 2), each as discussed above. In at least one example, the method 600 is implemented by the controller to control the power converter to generate a trapezoidal inductor current waveform.

At operation 605, the controller controls the power converter to provide Vout based on at least partially on Vin and Vref. In at least some examples, the controller further controls the power converter to provide Vout at least partially based on a feedback signal (which may be Vout or a scaled representation of Vout). The controller controls the power converter, for example, according to a triangular control pattern in which the power converter is either operating in Ton (e.g., charging an inductor from Vin) or operating in Toff (e.g., discharging an inductor to Vout). To control the power converter according to the triangular control pattern, in at least one example the controller controls two pairs of power transistors of the power converter to toggle states (e.g., turned on to turned off or vice versa) during any one given switching operation.

At operation 610, the controller determines whether the power converter is operating in a buck-boost region at least partially based on any one or more of Vin, Vout, and/or IL. The controller may determine whether the power converter is operating in the buck-boost region according to any suitable method, a scope of which is not limited herein. When the power converter is not operating in the buck-boost region, the method 600 returns to operation 605. When the power converter is operating in the buck-boost region, the method 600 continues to operation 615. In at least some examples, while the method 600 performs operation 615, the method 600 may continue controlling the power converter according to operation 605 until such time as operation 610 dictates a transition to operation 615.

At operation 615, the controller controls the power converter to provide Vout based on at least partially on Vin, Vref, and an indication that the power converter is operating in the buck-boost region. The controller controls the power converter, for example, according to a trapezoidal control pattern in which the power converter is either operating in Ton (e.g., charging an inductor from Vin), operating in Toff (e.g., discharging an inductor to Vout), or operating in a common mode (e.g., such COM1 or COM2, as discussed above with respect to FIG. 5, in which Vin is shorted to Vout, such as through the inductor). In various examples, any one or more of Ton, Toff, COM1, and/or COM2 may be variable (e.g., at least partially dependent on a value determined by the controller, such as by a loop controller comparing an output of the power converter to a reference value). Additionally, any one or more of Ton, Toff, COM1, and/or COM2 may further be a fixed value (e.g., independent of calculation by the loop controller and/or the controller). Furthermore, any one or more of Ton, Toff, COM1, and/or COM2 may be a timer-based value determined by a timer implemented in, or coupled to, the controller but independent of comparisons by the loop controller and/or controller of the output of the power converter to the reference value. To control the power converter according to the trapezoidal control pattern, in at least one example the controller controls one pair of power transistors of the power converter to toggle states (e.g., turned on to turned off or vice versa) during any one given switching operation. In at least some examples, the method 600 proceeds from operation 615 back to operation 610 to determine whether the power converter continues to operate in the buck-boost region. In at least some examples, while the method 600 returns to operation 610, the method 600 may continue controlling the power converter according to operation 615 until such time as operation 610 dictates a transition to operation 605.

While the operations of the method 600 have been discussed and labeled with numerical reference, the method 600 may include additional operations that are not recited herein, any one or more of the operations recited herein may include one or more sub-operations, any one or more of the operations recited herein may be omitted, and/or any one or more of the operations recited herein may be performed in an order other than that presented herein (e.g., in a reverse order, substantially simultaneously, overlapping, etc.), all of which is intended to fall within the scope of the present disclosure.

In the foregoing discussion and in the claims, the terms "including," and "comprising" are used in an open-ended fashion, and thus should be interpreted to mean "including, but not limited. to . . . ." Also, the term "couple" or "couples" is intended to mean either an indirect or direct wired or wireless connection. Thus, if a first device, element or component couples to a second device, element or component, that connection may be through a direct connection or through an indirect connection via other devices, elements or components and connections. Similarly, a device that is coupled between a first component or location and a second component or location may be through a direct connection or through an indirect connection via other devices and connections. Additionally, uses of the phrase "ground voltage potential" in the foregoing discussion are intended to include a chassis ground, an Earth ground, a floating ground, a virtual ground, a digital ground, a common ground, and/or any other form of ground connection applicable to, or suitable for, the teachings of the present disclosure. Unless otherwise stated, "about," "approximately," or "substantially" preceding a value means+/−10 percent of the stated value.

The above discussion is meant to be illustrative of the principles and various embodiments of the present disclosure. Numerous variations and modifications will become apparent to those skilled in the art once the above disclosure is fully appreciated. It is intended that the following claims be interpreted to embrace all such variations and modifications.

What is claimed is:

1. A power converter controller comprising:
   a loop controller configured to monitor an inductor current of an inductor associated with a power converter and generate a control signal based on the inductor current;
   a detector configured to determine whether the power converter is operating in a buck-boost region; and
   a gate driver coupled to the loop controller and the detector, the gate driver configured to control the power converter according to a trapezoidal control pattern based on the control signal when the detector indicates that the power converter is operating in the buck-boost region.

2. The power converter controller of claim 1, wherein the loop controller is configured to monitor the inductor current and a feedback signal representative of an output voltage of the power converter and generate the control signal based on the inductor current and the feedback signal.

3. The power converter controller of claim 1, wherein the gate driver comprises:
   a driver configured to generate a gate driver signal for driving the power converter; and
   digital logic coupled to the detector and the driver, the digital logic configured to control the driver to generate a gate drive signal according to the trapezoidal control pattern when the detector indicates that the power converter is operating in the buck-boost region.

4. The power converter controller of claim 1, wherein the trapezoidal control pattern includes an on-time (Ton) during which the inductor is charged, an off-time (Toff) during which the inductor is discharged, and at least one common mode time during which an input associated with the power converter is coupled to an output of the power converter through the inductor.

5. The power converter controller of claim 1, wherein the detector is configured to determine whether the power converter is operating in the buck-boost region according to an input voltage of the power converter and an output voltage of the power converter.

6. The power converter controller of claim 1, wherein the detector is configured to determine whether the power converter is operating in the buck-boost region according to an input voltage of the power converter and the inductor current of the inductor associated with the power converter.

7. The power converter controller of claim 1, wherein the detector is configured to determine whether the power converter is operating in the buck-boost region according to an output voltage of the power converter and the inductor current of the inductor associated with the power converter.

8. A power converter controller comprising:
a loop controller configured to monitor a feedback signal representative of an output voltage of a power converter and generate a control signal based on the feedback signal;
a detector configured to determine whether the power converter is operating in a buck-boost region; and
a gate driver coupled to the loop controller and the detector, the gate driver configured to control the power converter according to a trapezoidal control pattern based on the control signal when the detector indicates that the power converter is operating in the buck-boost region.

9. The power converter controller of claim 8, wherein the loop controller is configured to monitor the feedback signal and an inductor current of an inductor associated with the power converter and generate the control signal based on the feedback signal and the inductor current.

10. The power converter controller of claim 8, wherein the gate driver comprises:
a driver configured to generate a gate driver signal for driving the power converter; and
digital logic coupled to the detector and the driver, the digital logic configured to control the driver to generate a gate drive signal according to the trapezoidal control pattern when the detector indicates that the power converter is operating in the buck-boost region.

11. The power converter controller of claim 8, wherein the trapezoidal control pattern includes an on-time (Ton) during which an inductor associated with the power converter is charged, an off-time (Toff) during which the inductor is discharged, and at least one common mode time during which an input associated with the power converter is coupled to an output of the power converter through the inductor.

12. The power converter controller of claim 8, wherein the detector is configured to determine whether the power converter is operating in the buck-boost region according to an input voltage of the power converter and the output voltage of the power converter.

13. The power converter controller of claim 8, wherein the detector is configured to determine whether the power converter is operating in the buck-boost region according to an input voltage of the power converter and an inductor current of an inductor associated with the power converter.

14. The power converter controller of claim 8, wherein the detector is configured to determine whether the power converter is operating in the buck-boost region according to the output voltage of the power converter and an inductor current of an inductor associated with the power converter.

15. A power converter controller comprising:
a detector configured to generate a buck-boost signal upon determining a power converter is operating in a buck-boost region; and
a gate driver coupled to the detector, and configured:
generate a first driver signal for charging an inductor of the power converter during a power transistor on-time (Ton) when the buck-boost signal is not asserted;
generate a second driver signal for discharging the inductor of the power converter during a power transistor off-time (Toff) when the buck-boost signal is not asserted; and
generate a third driver signal for coupling an input of the power converter to an output of the power converter via the inductor during a common mode time when the buck-boost signal is asserted.

16. The power converter controller of claim 15, wherein the common mode time is between Ton and Toff.

17. The power converter controller of claim 15, wherein the gate driver is configured to cyclically deliver the first, second, third driver signals to the power converter for generating a trapezoidal inductor current pattern.

18. The power converter controller of claim 15, further comprising:
a loop controller configured to monitor an inductor current of the and generate a control signal based on the inductor current,
wherein the gate driver is configured to generate the second driver signal based on the control signal and the buck-boost signal.

19. The power converter controller of claim 15, further comprising:
a loop controller configured to monitor a feedback signal representative of an output voltage of the power converter of the and generate a control signal based on the inductor current,
wherein the gate driver is configured to generate the second driver signal based on the feedback signal and the buck-boost signal.

20. The power converter controller of claim 15, wherein:
the third driver signal is configured to turn on a first power transistor of the power converter to enable a first conductive path between the input and a first terminal of the inductor; and
the third driver signal is configured to turn on a second power transistor of the power converter to enable a second conductive path between a second terminal of the inductor and the output.

* * * * *